United States Patent
Eissa et al.

(10) Patent No.: US 11,508,721 B2
(45) Date of Patent: Nov. 22, 2022

(54) INTEGRATED FLUXGATE DEVICE

(71) Applicant: TEXAS INSTRUMENTS INCORPORATED, Dallas, TX (US)

(72) Inventors: Mona M. Eissa, Allen, TX (US); Mark R. Kimmich, Frisco, TX (US); Sudtida Lavangkul, Richardson, TX (US); Sopa Chevacharoenkul, Richardson, TX (US); Mark L. Jenson, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 45 days.

(21) Appl. No.: 17/228,631

(22) Filed: Apr. 12, 2021

(65) Prior Publication Data

US 2021/0233903 A1  Jul. 29, 2021

Related U.S. Application Data

(62) Division of application No. 15/003,856, filed on Jan. 22, 2016, now Pat. No. 10,978,448.

(51) Int. Cl.
*H01L 27/06* (2006.01)
*G01R 33/04* (2006.01)
*G01R 33/05* (2006.01)

(52) U.S. Cl.
CPC .......... *H01L 27/0617* (2013.01); *G01R 33/04* (2013.01); *G01R 33/05* (2013.01)

(58) Field of Classification Search
CPC ......... H01L 27/22; H01L 43/02; H01L 43/10; H01L 43/12
See application file for complete search history.

(56) References Cited

U.S. PATENT DOCUMENTS 5,975,912 A 11/1999 Hillman et al.
7,382,123 B2 * 6/2008 Na .................. G01R 33/05
324/249

(Continued)

FOREIGN PATENT DOCUMENTS

CN 1979807 A 6/2007
CN 103460066 A 12/2013

(Continued)

OTHER PUBLICATIONS

Machine Translation CN103460066A.

(Continued)

*Primary Examiner* — Mark W Tornow
(74) *Attorney, Agent, or Firm* — Michael A. Davis, Jr.; Charles A. Brill; Frank D. Cimino

(57) ABSTRACT

An integrated circuit has a substrate, a circuit, a core structure, a first encapsulation layer, a second encapsulation layer, and an oxide layer. The circuit includes transistors with active regions developed on the substrate and a metal layer formed above the active regions to provide interconnections for the transistors. The core structure is formed above the metal layer. The first encapsulation layer covers the core structure, and it has a first thermal expansion coefficient. The second encapsulation layer covers the first encapsulation layer over the core structure, and it has a second thermal expansion coefficient that is different from the first thermal expansion coefficient. As a part of the stress relief structure, the oxide layer is formed above the second encapsulation layer. The oxide layer includes an oxide thickness sufficient to mitigate a thermal stress between the first and second encapsulation layers.

5 Claims, 10 Drawing Sheets

(56) References Cited

U.S. PATENT DOCUMENTS

| | | |
|---|---|---|
| 7,389,579 B2 | 6/2008 | Na et al. |
| 7,737,687 B2 | 6/2010 | Na et al. |
| 2005/0024050 A1 | 2/2005 | Na et al. |
| 2014/0077796 A1 | 3/2014 | Schatz et al. |
| 2014/0167193 A1* | 6/2014 | Iuliano ............... G01R 33/0052 257/427 |
| 2015/0187488 A1 | 7/2015 | Williams et al. |
| 2015/0338474 A1 | 11/2015 | Mohan et al. |

FOREIGN PATENT DOCUMENTS

| | | |
|---|---|---|
| CN | 104576497 A | 4/2015 |
| EP | 273195 B1 | 6/1993 |

OTHER PUBLICATIONS

Machine Translation CN104576497A.
Machine Translation CN1979807A.
The State Intellectual Property Office of P.R.C Search Report.
Chinese Office Action dated Oct. 11, 2021.
Search Report for PCT Patent Application No. PCT/US17/14587, date of mailing of the international search report dated May 4, 2017, 1 page.

* cited by examiner

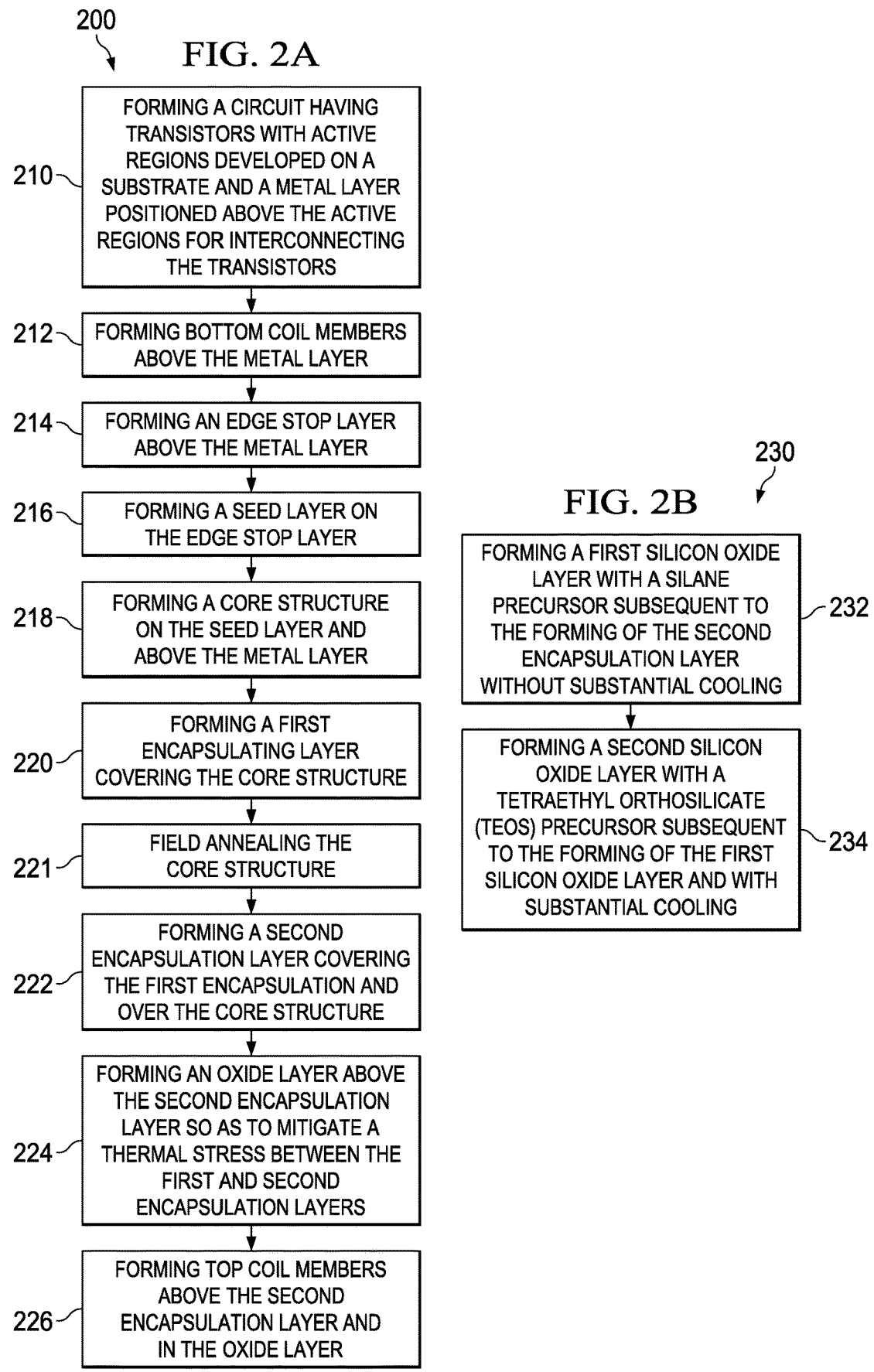

INTEGRATED FLUXGATE DEVICE

CROSS-REFERENCE TO RELATED APPLICATION

This application is a divisional of U.S. patent application Ser. No. 15/003,856 filed Jan. 22, 2016, which is incorporated herein by reference.

BACKGROUND

A fluxgate device generally includes a magnetic core structure and coil members coiling around the magnetic core. The fluxgate device can be used for detecting a change in magnetic flux in an environment adjacent to the magnetic core structure. Attempts have been made to interface a fluxgate device with an integrated circuit for adapting to various industrial applications. For instance, a fluxgate device interfaced with a control circuit can be adapted as current measurement devices for use in motor control systems, or as position sensing device for use in robotic systems. However, these solutions are generally costly to implement and complex to operate. Thus, there is a need for a fluxgate device that can be fabricated using a low-cost and high-yield process that is integratable with one or more control circuits.

SUMMARY

In one aspect, a described integrated fluxgate device includes a stress relief structure for mitigating a thermal stress between two or more encapsulation layers covering a magnetic core. Advantageously, the stress relief structure helps prevent one or more corners of the fluxgate device from cracking, thereby increasing the overall yield of a described fabrication process for integrated the fluxgate with one or more control circuits.

In one implementation, for example, an integrated circuit has a substrate, a circuit, a core structure, a first encapsulation layer, a second encapsulation layer, and an oxide layer. The circuit includes transistors with active regions developed on the substrate and a metal layer formed above the active regions to provide interconnections for the transistors. The core structure is formed above the metal layer. The first encapsulation layer covers the core structure, and it has a first thermal expansion coefficient. The second encapsulation layer covers the first encapsulation layer over the core structure, and it has a second thermal expansion coefficient that is different from the first thermal expansion coefficient. As a part of the stress relief structure, the oxide layer is formed above the second encapsulation layer. The oxide layer includes an oxide thickness that is sufficient to mitigate a thermal stress between the first and second encapsulation layers.

In another implementation, for example, an integrated fluxgate device hasg a substrate, a circuit, a fluxgate, a first silicon oxide layer, and a second silicon oxide layer. The circuit includes transistors with active regions developed on the substrate and a metal layer formed above the active regions to provide interconnections for the transistors. The fluxgate includes a magnetic core formed above the metal layer, a titanium layer covering the magnetic core, and a nitride layer covering the titanium layer over the magnetic core. As a part of the stress relief structure, the first oxide layer is formed from a silane precursor, the first silicon oxide layer positioned above the nitride layer. The second silicon oxide layer formed from a tetraethyl orthosilicate (TEOS) precursor, the second silicon oxide layer is positioned above the first silicon oxide layer.

In yet another implementation, for example, in a method for fabricating an integrated circuit, the method includes forming a circuit on a substrate. The circuit includes transistors with active regions developed on the substrate and a metal layer positioned above the active regions for interconnecting the transistors. The method also includes forming a core structure above the metal layer. The method further includes forming a first encapsulation layer, a second encapsulation layer, and an oxide layer. The first encapsulation layer covers the core structure, and it has a first thermal expansion coefficient. The second encapsulation layer covers the first encapsulation layer over the core structure, and it has a second thermal expansion coefficient different from the first thermal expansion coefficient. As a part of the stress relief structure, the oxide layer is formed above the second encapsulation layer. The oxide layer includes an oxide thickness that is sufficient to mitigate a thermal stress between the first and second encapsulation layers.

BRIEF DESCRIPTION OF THE DRAWINGS

FIG. 2A shows a flow chart of a process for fabricating an integrated fluxgate circuit according to an aspect of this description.

FIG. 2B shows a flow chart of a process for forming a stress relief layer according to an aspect of this description.

DETAILED DESCRIPTION

Like reference symbols in the various drawings indicate like elements. The drawings are not necessarily drawn to scale.

Figure 1:
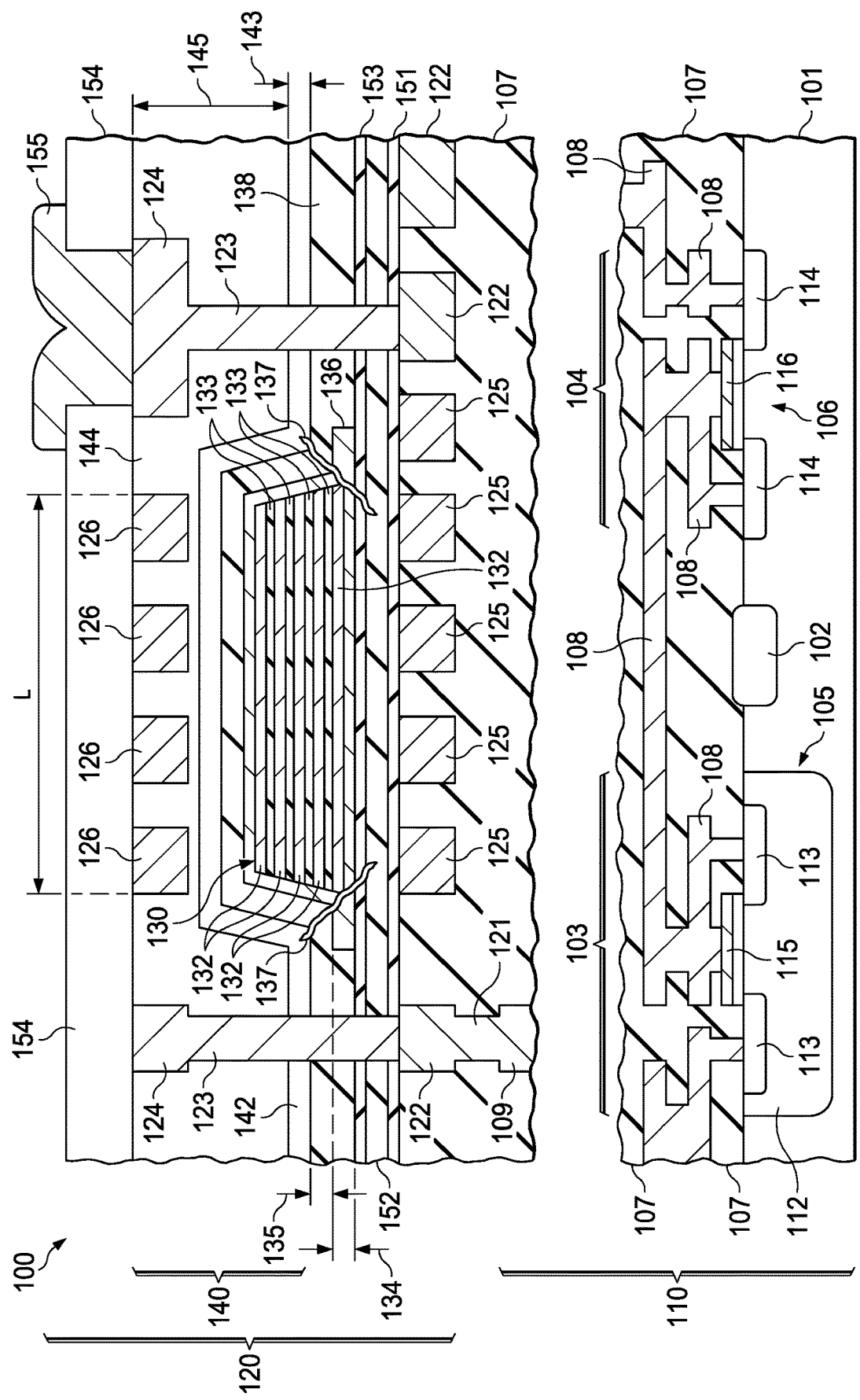
FIG. 1 shows a cross-sectional view of an integrated fluxgate circuit according to an aspect of this description.

FIG. 1 shows a cross-sectional view of an integrated fluxgate circuit 100 according to an aspect of this description. The integrated fluxgate circuit 100 includes a circuit 110 and a fluxgate device 120 integrated with the circuit 110 to form a single integrated circuit die. According to an aspect of this description, the circuit 110 includes one or more control circuits that are coupled to the fluxgate device 120. The circuit 110 can thus be used for controlling the operations of the fluxgate device 120. For instance, the circuit 110 may calibrate the fluxgate device 120 and receive one or more current signals from the fluxgate device 120. Based on the received current signals, the circuit 110 may sense a motion or a position by determining a change in magnetic flux in association with the received current signals. The circuit 110 can be an integrated circuit with two or more transistors formed on a substrate and connected by one or more interconnect wiring layers. In one implementation, for example, the circuit 110 is formed on a substrate 101, which includes a semiconducting material such as silicon. The circuit 110 includes a first transistor 103 and a second transistor 104 formed on the substrate 101.

The first transistor 103 is formed on a first active region 105, whereas the second transistor 104 is formed on a second active region 106. The first transistor 103 can be a p-channel device in that the first active region 105 includes an n-well 112 and a couple of p-doped regions 113 formed in the n-well 112. The p-doped regions 113 serve as the drain and source terminals of the first transistor 103, each of which is coupled to interconnect wiring layers 108. The first transistor 103 includes a gate structure 115 that defines a channel region between the p-doped regions 113. The gate structure 115 is also coupled to the interconnect wiring layers 108.

The second transistor 104 can be an n-channel device in that the second active region 106 is a part of the substrate 101, which can include p-doped materials. The second active region 106 is separated from the first active region by a field oxide element 102, which typically resides in a shallow trench isolation region. The second active region 106 may include a couple of n-doped regions 114, which serve as the drain and source terminals of the second transistor 104. Each of the n-doped region 114 is coupled to the interconnect wiring layers 108. The second transistor 104 includes a gate structure 116 that defines a channel region between the n-doped regions 114. The gate structure 116 is also coupled to the interconnect wiring layers 108.

Although FIG. 1 illustrates two particular types of transistors having active regions arranged in a particular fashion, the circuit 110 may include other types of transistors characterized by different active region arrangements. In one implementation, for example, the circuit 110 may operate under high voltage conditions. As such, the circuit 110 may include lateral diffused metal oxide semiconductor (LDMOS) transistors, which in some arrangements, may include deep trench structures surrounding one or more active regions. In another implementation, for example, the circuit 110 may be fabricated using Bi-CMOS technologies. As such, the circuit 110 may include both CMOS transistors and bipolar junction transistors.

The interconnect wiring layers 108 are separated by several inter-level dielectric (ILD) layers 107. Depending on the complexity of the circuit 110, the number of interconnect wiring layers 108 may vary. Moreover, the interconnect wiring layers 108 includes a top interconnect layer 109 that is directly under and connected to the fluxgate device 120. The interconnect wiring layers 108 may include polysilicon and/or a conductive material such as copper and aluminum. The interconnect wiring layers 108 are connected using one or more via structures, which can be filled with a conductive material such as tungsten.

The top interconnect layer 109 includes one or more metallic materials such as copper and aluminum. The top interconnect layer 109 may be coupled to the fluxgate device 120 through a first fluxgate metal layer 122 and an inter-device via 121. The fluxgate device 120 is formed above the interconnect wiring layers 108 and the top interconnect layer 109. In general, the fluxgate device 120 includes a set of lower coil members 125, a set of upper coil members 126, and a magnetic core structure 130.

The lower coil members 125 can be formed using the same process as the first fluxgate metal layer 122; whereas the upper coil member 126 can be formed using the same process as a second fluxgate metal layer 124. The second fluxgate metal layer 124 can be connected to the first fluxgate metal layer 122 through an intra-fluxgate via 123. The fluxgate device 120 may include one or more etch stop layers to protect the circuit 110 during the fabrication process of the fluxgate device 120. In one implementation, for example, the fluxgate device 120 includes a first etch stop layer 151 formed above the ILD layer 107, a dielectric layer 152 formed on the first etch stop layer 152, and a second etch stop layer 153 formed on the dielectric layer 152. Each of the layers 151, 152, and 153 may also serve as an insulation layer for insulating the fluxgate device 120 from the circuit 110. The first and second etch stop layers 151 and 153 may include a nitride material such as silicon nitride. The dielectric layer 152 may include an oxide material such as silicon oxide.

The magnetic core structure 130 is formed above the top interconnect metal layer 109 and thus defines a plateau protruding above the top interconnect metal layer 109. The magnetic core structure 130 includes multiple magnetic layers 132 interleaving with multiple insulating layers 133. In one implementation, each of the magnetic layers 132 includes a nickel iron (NiFe) alloy. More specifically, each of the magnetic layers 132 may include a weight ratio of about 80% nickel to 20% iron. For example, the magnetic layers 132 may include 82 weight percent of nickel and 18 weight percent of iron. And each of the magnetic layers 132 may have a thickness of 3,350 Å. The insulating layers 133 serve to insulate the magnetic layers 132 from one another. In one implementation, each of the insulating layers 133 includes an aluminum nitride (AlN) material. And each of the insulating layers 133 may have a thickness of 70 Å.

The magnetic core structure 130 is protected by the first encapsulation layer 136 and the second encapsulation layer 138. The first encapsulation layer 136 has a bottom portion serves as a seed layer for developing the magnetic core structure 130. The bottom portion of the first encapsulation layer 136 is insulated from the top interconnect metal layer 122 by an insulation layer such as layers 151, 152, and 153. The first encapsulation layer 136 also includes a top portion to cover and protect the magnetic core structure 130. The first encapsulation layer 136 includes a metallic material that is suitable for developing the magnetic core structure 130 thereon and protecting the magnetic core structure 130 thereunder from various types of process stress. In one implementation, for example, the first encapsulation layer 136 includes a titanium (Ti) metal, which has a relatively high thermal expansion coefficient (e.g., at about 8.6×10E-6 m/K).

The second encapsulation layer 138 protects and insulates the first encapsulation layer 136. The second encapsulation layer 138 includes a top portion that covers the first encapsulation layer 136. The second encapsulation layer 138 also includes a bottom portion on which the first encapsulation layer 136 is formed. In one implementation, for example, the bottom portion of the second encapsulation layer 138 can be the second etch stop layer 153. In another implementation, for example, the bottom portion of the second encapsulation layer 138 may include an insulation layer (not shown) formed between the second etch stop layer 153 and the bottom portion of the first encapsulation layer 136. The second encapsulation 138 includes a material that is suitable for insulating the first encapsulation layer 136 and protecting the first encapsulation layer 136 from one or more etching process. In one implementation, for example, the second encapsulation layer 138 includes a nitride material (e.g., silicon nitride), which has a relatively low thermal expansion coefficient (e.g., ranges from 1.47×10E-6 m/K to 3.7×10E-6 m/K) when compared to the thermal expansion coefficient of the first encapsulation layer 136.

Due to the difference in thermal expansion coefficients between the first encapsulation layer 136 and the second encapsulation layer 138, these two layers may experience a significant thermal mechanical stress when there is a substantial temperature change during the fabrication process. In particular, one of these two layers may expand or contract at a much higher rate than the other layer. As a result of this thermal mechanical stress, the integrated fluxgate circuit 100 may experience cracking along crack lines 137 surrounding the bottom corners of the magnetic core structure 130. The severity of these crack lines 137 depends on a few factors. One factor includes the longitudinal size (L) of the magnetic core structure 130. In general, the longitudinal size (L) of the magnetic core structure 130 can be understood as the greater one of the longitudinal length or longitudinal width of the magnetic core structure 130. In one implementation, for example, the magnetic core structure 130 may have a longitudinal width of 100 um, a longitudinal length of 1,450 um, and a thickness of 1.73 um. Then, the longitudinal size (L) of the magnetic core structure 130 can be 1,450 um.

The relatively large longitudinal size (L) of the magnetic core structure 130 creates a specific problem not presented in conventional integrated circuits. This relatively large longitudinal size (L) exacerbates the thermal mechanical stress between the first encapsulation layer 136 and the second encapsulation layer 138. In particular, the second encapsulation layer 138 may be formed under high temperature (e.g., 400° C.), and the fabrication process may involve substantial cooling before the integrated fluxgate circuit 100 undergoes the next process step. The substantial cooling can be attributed to switching of process chambers, transportation of wafers, and/or process tool preparation time. In any event, the substantial cooling may range from a 150° C. drop to more than a 200° C. drop.

This substantial drop of process temperature causes the first encapsulation layer 136 to contract at a significantly different pace from the second encapsulation layer 138. In the event that the first encapsulation layer 136 includes a titanium material and the second encapsulation layer 138 includes a nitride material, the first encapsulation layer 136 will contract at a much faster pace than the second encapsulation layer 138 when there is a substantial cooling. As a result, the first and second encapsulation layers 136 and 138 will experience a thermal mechanical stress asserted in between them. This thermal mechanical stress is heightened especially when the magnetic core structure 130 includes a material (e.g., NiFe) with a thermal expansion coefficient that is even higher than that of the first encapsulation layer 136. When the thermal mechanical stress is high enough, the first and second encapsulation layers 136 and 138 may crack along the crack lines 137. These crack lines 137 may extend downward to the circuit 110, which may impact the structural integrity of the interconnect wiring layers 108.

This description provides a cost efficient solution to mitigate the thermal mechanical stress between the first and second encapsulation layers 136 and 138, and any other structures for protecting and/or insulating the magnetic core structure 130. The described solution includes a stress relief structure formed above the second encapsulation layer 138. According to one aspect of the solution, the described stress relief structure has a thermal expansion coefficient that is lower than that of the second encapsulation layer 138. According to another aspect of the solution, the described stress relief structure covers the second encapsulation layer 138 and has a thickness that is within the same magnitude as the thickness of the second encapsulation layer 138. According to yet another aspect of the solution, the described stress relief structure is formed shortly after the second encapsulation layer 138 is formed and within similar temperature ranges as the second encapsulation layer 138 is formed. To that end, the described stress relief structure is formed without the substantially cooling of the second encapsulation layer 138 after the second encapsulation layer 138 is formed.

In one implementation, for instance, the described stress relief structure includes an oxide layer 140 formed above the second encapsulation layer 138. In general, the oxide layer 140 may have a thermal expansion coefficient of about 5.6×10E-7 m/V, which is lower than that of the second encapsulation layer 138. The oxide layer 140 includes an oxide thickness (e.g., 143, or 143 in combination with 145) that is sufficient to mitigate the thermal mechanical stress (hereinafter "thermal stress") between the first and second encapsulation layers 136 and 138. The entire oxide layer 140 may be formed without substantial cooling after the second encapsulation layer 138 is formed. Alternatively, a lower portion (e.g., a first oxide layer 142) of the oxide layer 140 can be formed without substantial cooling while an upper portion (e.g., a second oxide layer 144) of the oxide layer 140 can be formed with substantial cooling.

To avoid substantial cooling of the second encapsulation layer 138, the oxide layer 140 can be formed using the same tool that forms the second encapsulation layer 138. For example, a plasma-enhanced chemical vapor deposition (PECVD) tool can be used for depositing the oxide layer 140 shortly after depositing the second encapsulation layer 138. To efficiently protect the encapsulation layers (e.g., 136 and/or 38) from cracking around the magnetic core structure 130, the oxide layer 130 may have a minimum thickness 143 that is sufficient to mitigate the thermal stress between the encapsulation layers. In one implementation, the minimum thickness 143 of the oxide layer 140 can be based upon a stress ratio of the thermal stress associated with the longitudinal size (L) of the magnetic core structure 130. The minimum oxide thickness 143 thus correlates to the stress ratio according to this aspect of this description. More specifically, the minimum oxide thickness 143 can be directly proportional to the stress ratio. That is, the higher the stress ratio, the greater the minimum oxide thickness 143. The stress ration can be defined by the encapsulation thickness (e.g., the first encapsulation thickness 134 and the second encapsulation thickness), the longitudinal size (L), and the thermal expansion coefficients of the respective encapsulation layers vis-a-vis the magnetic core structure 130.

For instance, where the second encapsulation layer 138 includes a nitride material with an encapsulation thickness 135, the minimum oxide thickness 143 of the oxide layer 140 can be at least 85% of the encapsulation thickness 135. More specifically, where the second encapsulation layer 138 includes a silicon nitride with a thickness of 4,700 Å, the minimum oxide thickness 143 of the oxide layer 140 can be 4,000 Å or more in order to preserve a crack-free encapsulation layer (e.g., 136 or 138).

To streamline the fabrication process, the process time for forming the second encapsulation layer 138 and the oxide layer 140 may be roughly the same so as to avoid substantial cooling of the second encapsulation layer 138 while allowing the minimum oxide thickness 143 to be developed. This process time allocation may lead to a relatively equal distribution of thickness between the second encapsulation layer 138 and a first oxide layer 142 (e.g., the lower portion of the oxide layer 140). To further reinforce the first oxide layer 142, a second oxide layer 144 (e.g., the upper portion of the oxide layer 140) may be formed on top of the first oxide layer 142. Because the first oxide layer 142 likely provides a sufficient amount of thermal stress relief to the encapsulation layer (e.g., the first and second encapsulation layers 136 and 138), the second oxide layer 144 may be formed after the encapsulation layers undergo substantial cooling. That is, the second oxide layer 144 may be formed with a process tool that is different from the process tool that forms the second encapsulation layer 138. Moreover, the second oxide layer 144 may include a second oxide thickness 145 in addition to the first oxide thickness (i.e., the minimum oxide thickness) 143.

In one implementation, the first oxide layer 142 may include a first silicon oxide material formed from a silane ($SiH_4$) precursor. The first oxide layer 142 generally conforms to a plateau contour defined by the magnetic core structure 130 because silane-based silicon oxide typically has good uniformity. The second oxide layer 144 may include a second silicon oxide material formed from a tetraethyl orthosilicate (TEOS) precursor, and the second oxide layer 144 is positioned above the first oxide layer 142. After a planarization process, the second oxide layer 144 generally conforms to a surface of the substrate 101. Then, a passivation layer 154 is formed above the oxide layer 140 for protecting the underlying circuitry. The passivation layer 154 defines one or more openings for depositing one or more bond pads 155.

FIG. 2A shows a flow chart of a process 200 for fabricating an integrated fluxgate circuit according to an aspect of this description. The process 230 may begin at step 210, which includes forming a circuit (e.g., the circuit 110) with active regions (e.g., active regions 105 and 106) developed on a substrate (e.g., the substrate 101). Step 210 also includes forming a metal layer (e.g., the interconnect wiring layers 108 and the top interconnect layer 109) that positioned above the active regions for interconnecting the transistors (e.g., the PMOS 103 and the NMOS 104) formed thereunder.

Figure 3A:
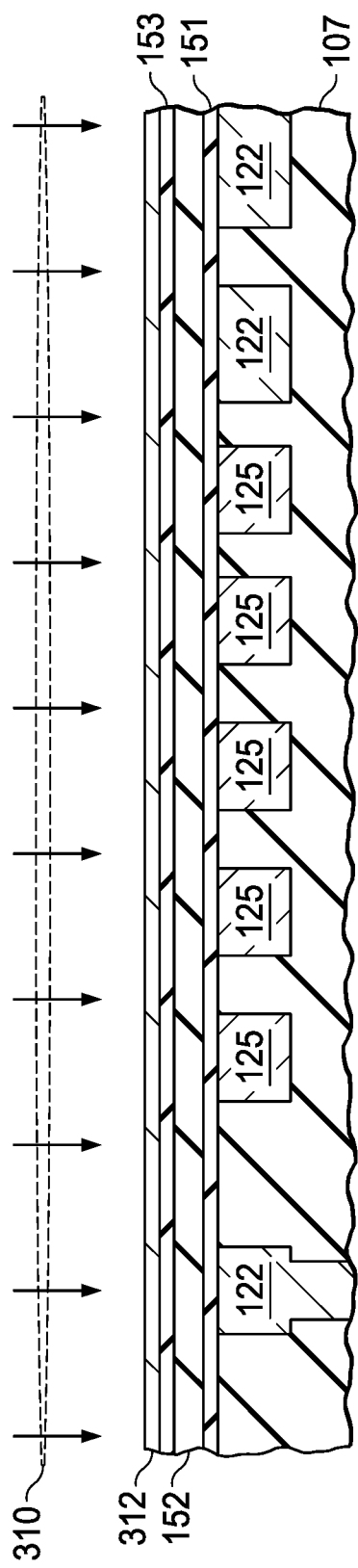
FIGS. 3A-3I show cross-sectional views of an integrated fluxgate circuit during a fabrication process according to an aspect of this description.

Step 212 includes forming bottom coil members (e.g., the bottom coil members 125) above the metal layer. Step 214 includes forming an edge stop layer (e.g., the second edge stop layer 153) above the metal layer. Step 216 includes forming a seed layer on the edge stop layer. FIG. 3A shows a cross sectional view of an integrated fluxgate device (e.g., 120) when step 216 is performed. A seed layer deposition 310 is performed using a target material to form a seed layer 312. In one implementation, the seed layer deposition 310 includes a physical vapor deposition, which can be plasma-enhanced (i.e., PEPVD), using titanium as a target material. Consequently, a titanium seed layer 312 is formed on the second etch stop layer 153, and the seed layer 312 may incur a thickness of 300 Å.

Figure 3B:
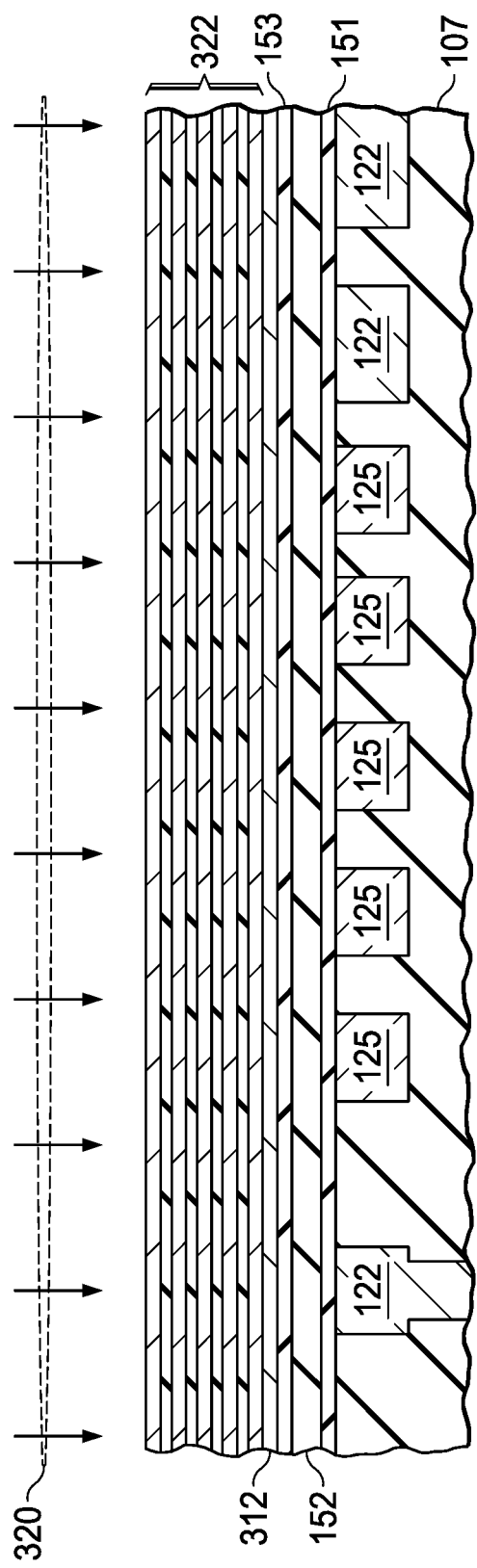
Figure 3C:
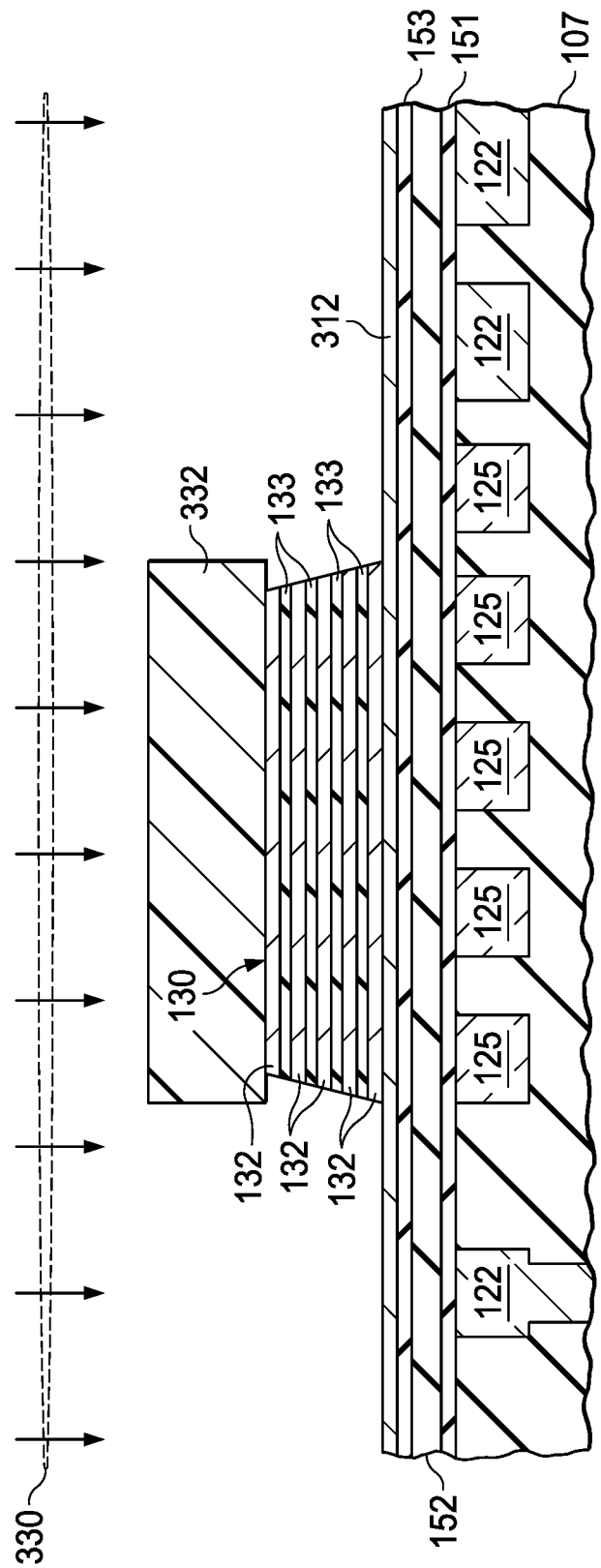

Next, the process 200 proceeds to step 218, which includes forming a core structure (e.g., the magnetic core structure 130) on the seed layer 312 and above the metal layer (e.g., the interconnect wiring layers 108 and the top interconnect layer 109). FIGS. 3B-3C shows cross sectional views of an integrated fluxgate device (e.g., 120) when step 218 is performed. Referring to FIG. 3B, a magnetic core deposition process 320 is performed to deposit interleaving magnetic layers and insulation layers. The magnetic core deposition process 320 includes the physical vapor deposition of the magnetic layers (e.g., 132) alternating with the chemical vapor deposition of the insulation layers (e.g., 133). Each magnetic layer may include a nickel iron alloy with a weight ratio of about 82% nickel to 18% iron and an average thickness of 3,350 Å. Though other weight ratios can be used, this particular weight ratio provides high permeability and high sensitivity, and it also lowers the saturation magnetization and operating current of the fluxgate device (e.g., 120). Moreover, this particular weight ratio may lower coercivity and magnetostriction, which leads to a lower noise figure. Each insulation layer may include an aluminum nitride compound with an average thickness of 70 Å. The insulation layers provide lamination to the magnetic layers. This lamination feature prevents degradation of magnetic properties with increasing thickness of the core structure. Moreover, this lamination feature reduces eddy current loss during operation. The physical vapor deposition and the chemical vapor deposition can be plasma-enhanced in one implementation. As a result of the magnetic core deposition process 320, a magnetic core layer 322 is formed.

Referring to FIG. 3C, a magnetic core patterning process 330 is performed to refine the horizontal (or planar) dimensions of a magnetic core structure (e.g., 130). As a result of a photolithography process, a photoresist mask 332 is formed on the magnetic core layer 322. The magnetic core patterning process 330 includes etching away a portion of the magnetic core layer 322 that is not protected under the photoresist mask 332. As a result of the etching, the magnetic core structure 130 is formed. In one implementation, for instance, the etching process can be a wet etch using diluted acid, such as phosphoric acid, citric acid, and/or nitric acid. The wet etch is isotropic and selective. As such, the wet etch can be stopped at the titanium seed layer 312.

Figure 3D:
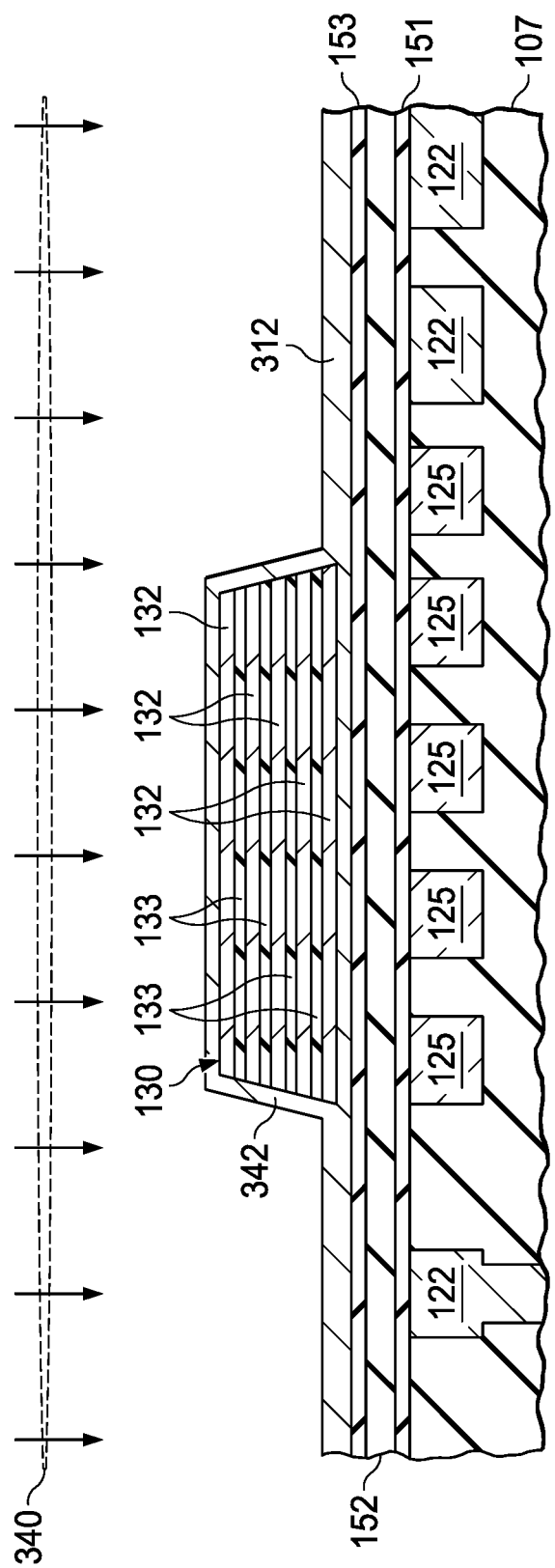
Figure 3E:
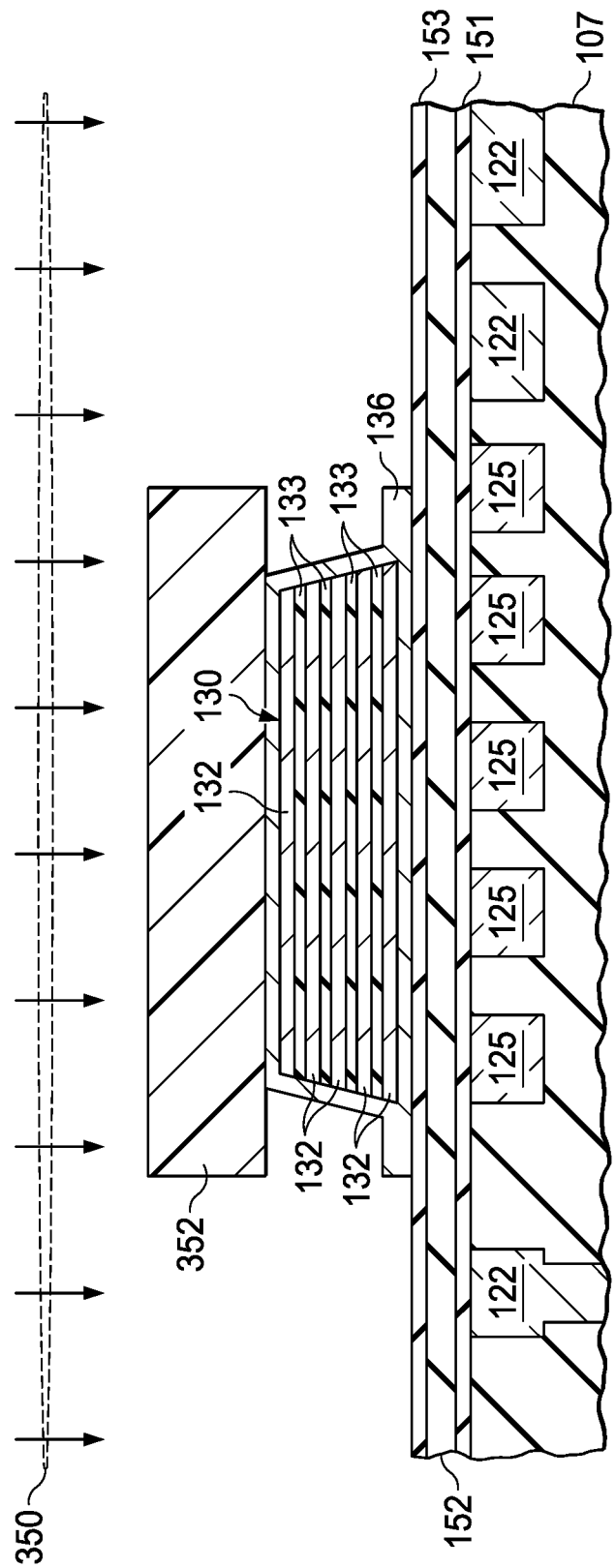

Next, the process 200 proceeds to step 220, which includes forming a first encapsulation layer (e.g., 136) covering the core structure (e.g., 130). FIGS. 3D-3E shows cross sectional views of an integrated fluxgate device (e.g., 120) when step 222 is performed. Referring to FIG. 3D, a first encapsulation layer deposition 340 is performed to deposit a top portion 342 of the first encapsulation layer (e.g., 136). In one implementation, the first encapsulation layer deposition 340 includes a physical vapor deposition, which can be plasma-enhanced (i.e., PEPVD), using titanium as a target material. The top portion 342 of the first encapsulation layer 342 may incur a thickness of 1,350 Å. Having a titanium oxide layer (not shown) formed in between, the top portion 342 bonds with the titanium seed layer 312 to form the first encapsulation layer (e.g., 136).

Referring to FIG. 3E, a first encapsulation layer patterning process 350 is performed to refine the horizontal (or planar) dimensions of first encapsulation layer (e.g., 136). As a result of a photolithography process, a photoresist mask 352 is formed on the top portion 342. The first encapsulation layer patterning process 350 includes etching away a part of the top portion 342 and the seed layer 312 that are not protected under the photoresist mask 352. As a result of the etching, the first encapsulation layer 136 is formed. In one implementation, the etching process can be a dry etch using plasma containing florin and/or chlorine gases. The etching process is isotropic and end point driven. As such, the dry etch can be stopped at the second etch stop layer 153 by detecting a nitride concentration of the process chamber.

Next, the process 200 proceeds to step 221, which includes performing field annealing of the core magnetic structure 130. During the field annealing process, the core magnetic structure 130 is placed under a permanent magnet at around 370° C. and for about 60 minutes. The permanent magnet is of substantial weight (e.g., 4 tons) such that the field annealing process may help improve the magnetic alignment process to achieve better uniformity across the wafer on which the integrated fluxgate circuit 100 is formed.

Figure 3F:
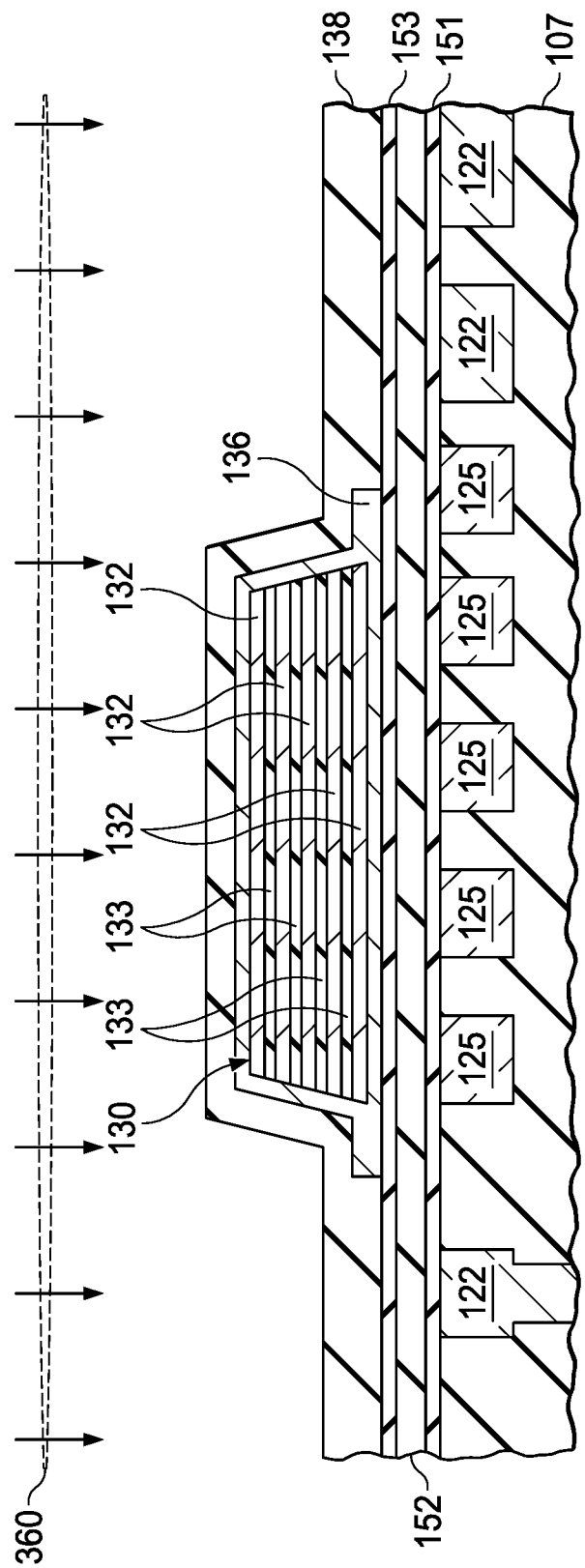

Next, the process 200 proceeds to step 222, which includes forming a second encapsulation layer (e.g., 138) covering the first encapsulation layer (e.g., 136) and over the core structure (e.g., 130). FIG. 3F shows a cross sectional view of an integrated fluxgate device (e.g., 120) when step 222 is performed. A second encapsulation layer deposition 360 is performed to deposit the second encapsulation layer 138. In one implementation, the second encapsulation layer deposition 360 includes using a chemical vapor deposition (CVD) tool, which can be plasma-enhanced (i.e., PECVD). The deposition 360 is performed in a chamber at a first CVD temperature around 400° C. and using silane ($SiH_4$) and nitrogen (N) as precursors. After a first deposition duration, the second encapsulation layer 138 includes a silicon nitride (SiN) material, which may have a thickness of 4,700 Å. Although the second encapsulation layer 138 can be further developed to have a greater thickness, it is advantageous to refrain from doing so in some cases. This is because depositing a silicon nitride layer is generally costly and difficult to control. And a prolonged silicon nitride deposition can produce more polymer byproducts that may impact the functionality of the fluxgate device 120. During the deposition 360, the second encapsulation layer 138 may bond with the second etch stop layer 153 to form a single encapsulation structure for insulating and protecting the magnetic core structure 130 inside of the first encapsulation layer 136.

After the second encapsulation layer deposition 360 is performed, the wafer containing the integrated fluxgate circuit 100 is transferred to another chamber while the CVD tool is being prepared for oxide deposition. To minimize the thermal stress asserted between the first and second encapsulation layers 136 and 138, or asserted by the magnetic core structure 130, the wafer may be kept near the first CVD temperature before the oxide layer (e.g., 140) is deposited. Thus, the wafer may be kept at a pre-CVD temperature that is not substantially below the first CVD temperature. In one implementation, for example, the pre-CVD temperature may be maintained at no lower than 250° C. where the first CVD temperature is at around 400° C.

In step 224, an oxide layer (e.g., 142 and/or 144) is formed above the second encapsulation layer 138 so as to mitigate a thermal stress between the first and second encapsulation layers 136 and 138. According to an aspect of this description, the oxide layer has an oxide thickness (e.g., 143, or 143 in combination with 145) that is sufficient to mitigate a thermal stress between the first and second encapsulation layers 136 and 138. The oxide layer can be deposited using the same CVD tool as the second encapsulation layer 138 and with a silane ($SiH_4$) precursor. The oxide layer deposition can be performed at the first CVD temperature or at a second CVD temperature that is near to the first CVD temperature. As an example, where the first CVD temperature is approximately 400° C. (i.e., plus or minus 10° C.), the second CVD temperature can be approximately 350° C. (i.e., plus or minus 10° C.).

Although the oxide layer 140 may have a greater thickness than the second encapsulation layer 138, it may be beneficial to pursue only a minimum oxide thickness (e.g., 143) during a first oxide layer deposition process in which the same CVD tool is used as in the second encapsulation layer deposition 360. Because a second oxide thickness 145 can be developed during a subsequent deposition process. Delaying the second oxide deposition (i.e., the subsequent CVD process) allows the overall fabrication process to be streamlined.

To that end, the process durations for forming the second encapsulation layer 138 and the first oxide layer 142 can be substantially equal to each other. Alternatively, the process duration for forming the second encapsulation layer 138 can be greater than the process duration for forming the first oxide layer 142. In either case, this back-to-back deposition process prevents substantial cooling of the second encapsulation layer 138 while allowing the minimum oxide thickness 143 to be developed. This process arrangement may lead to a relatively similar distribution of thickness between the second encapsulation layer 138 and a first oxide layer 142.

Figure 3G:
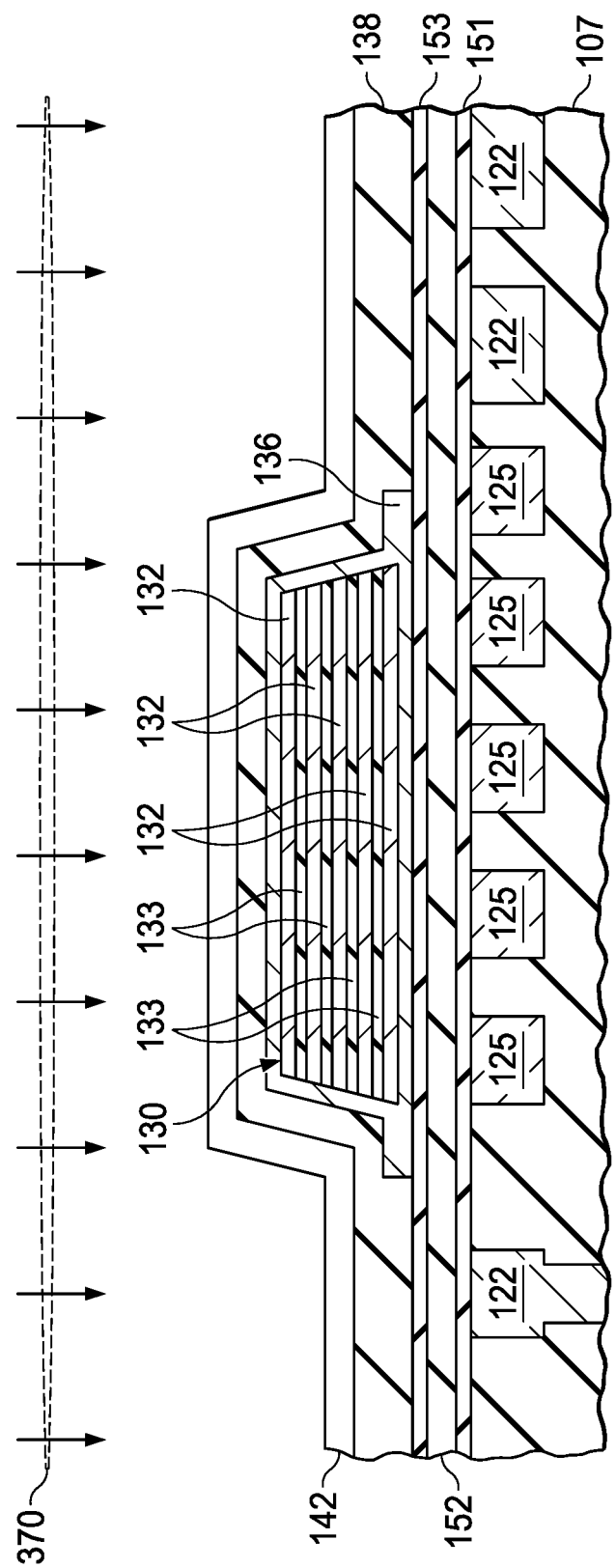

Thus, step 224 may be performed to deposit a single layer of oxide during one deposition process or multiple layers of oxide during multiple deposition processes. For the second scenario, step 224 may be implemented according to a process 230 as shown in FIG. 2B. The process 230 starts at step 232, which includes forming a first silicon oxide layer 142 with a silane precursor subsequent to the forming of the second encapsulation layer 138. FIG. 3G, shows a cross sectional view of an integrated fluxgate device (e.g., 120) when step 232 is performed. A first oxide layer deposition 370 is performed to deposit a first oxide layer 142. In one implementation, the first oxide layer deposition 370 includes using the same chemical vapor deposition (CVD) tool as the second encapsulation layer deposition 360, which can be plasma-enhanced (i.e., PECVD). The deposition 370 is performed in a chamber at a second CVD temperature, which can be the same or is near to the first CVD temperature. For example, where the first CVD temperature is around 400° C. (i.e., plus or minus 10° C.), the second CVD temperature can be about 350° C. (i.e., plus or minus 10° C.) or higher.

The deposition 370 applies silane ($SiH_4$) and oxygen (O) as precursors. The first oxide layer 142 thus includes a silicon oxide material with a minimum oxide thickness 143. The second deposition duration of the first oxide layer 142 may be substantially the same as, or less than, the first deposition duration of the second encapsulation layer deposition 360. Because silicon oxide formed by a silane precursor typically has good uniformity, the first silicon oxide layer 142 conforms to a contour of the magnetic core structure 130. According to an aspect of this description, the minimum oxide thickness 143 can be 4,000 Å where the second encapsulation layer 138 has a thickness of about 4,700 Å. Although the deposition 370 may further develop the silicon oxide layer to a greater thickness, it is advantageous to refrain from doing so in some cases. This is because the second encapsulation layer deposition 360 as shown in FIG. 3F uses the same deposition tool as the first oxide layer deposition 370. By delaying the silicon oxide growth to a later time, the overall fabrication process can be streamlined as the depositions 360 and 370 can take turn sharing the same deposition tool to prevent substantial cooling of the deposited layers (i.e., 130, 136, and 138). Advantageously, the arrangement of the depositions 360 and 370 allows the integrated fluxgate circuit 100 to be substantially crack-free around the corners of the magnetic core structure 130.

In an alternative implementation, a tetraethyl orthosilicate (TEOS) precursor can be used in the deposition 370 for forming the first oxide layer 142. However, silicon oxide layers formed by TEOS precursors typically have lower uniformity than those formed by silane precursors. Hence, the TEOS-based silicon oxide layer may or may not conform to the contour of the magnetic core structure 130. In the event that the TEOS-based silicon oxide layer does not conform well to the contour of the magnetic core structure 130, the TEOS-based silicon oxide layer may be less effective in performing its stress relief function. Accordingly, it may be more preferable to use TEOS-based silicon oxide to grow on top of the silane-based silicon oxide.

Figure 3H:
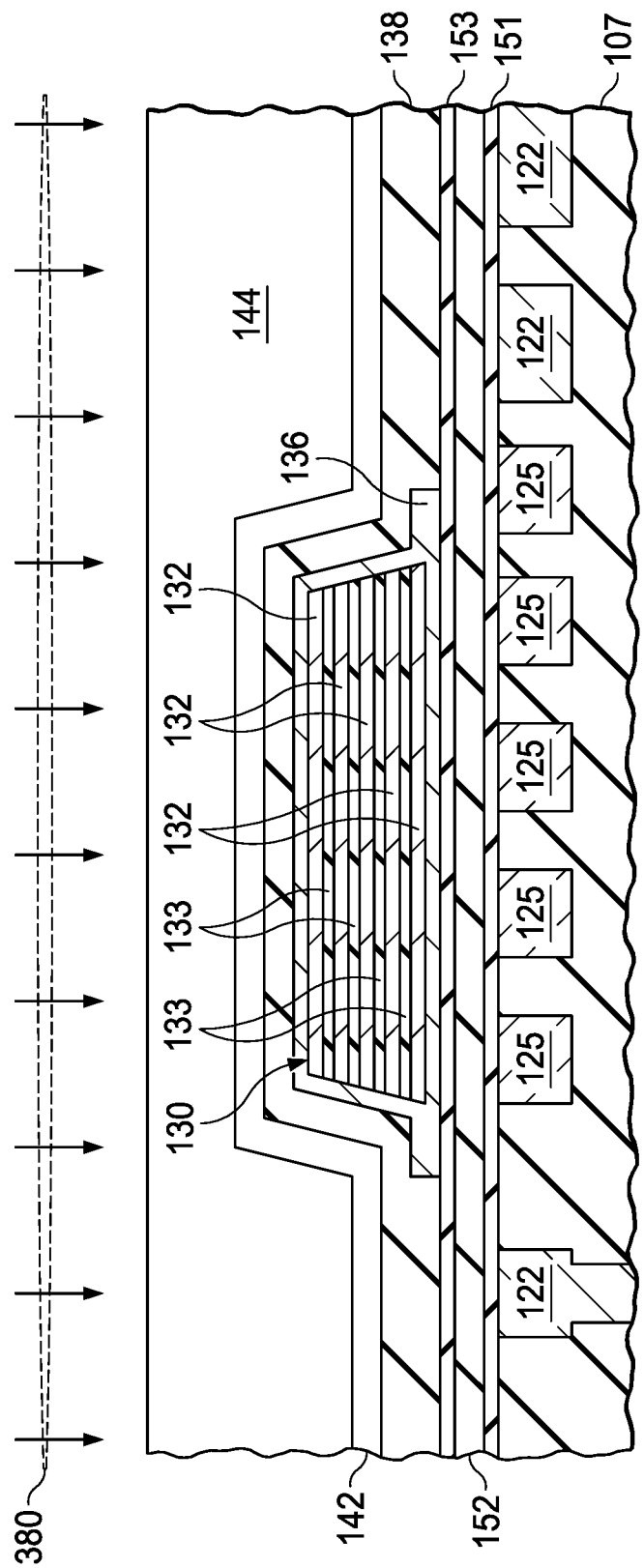

After step 232 is performed, the process 230 proceeds to step 234, which includes forming a second silicon oxide layer 144 with a tetraethyl orthosilicate (TEOS) precursor subsequent to the forming of the first silicon oxide layer 142. Since the first silicon oxide layer 142 is already in place to serve as a stress relief structure, the integrated fluxgate circuit 100 may undergo substantial cooling without sustaining any crack at the corners of the magnetic core structure 130. FIG. 3H, shows a cross sectional view of an integrated fluxgate device (e.g., 120) when step 234 is performed. A second oxide layer deposition 380 is performed to deposit a second oxide layer 144. In one implementation, the second oxide layer deposition 380 includes using the same chemical vapor deposition (CVD) tool as the second encapsulation layer deposition 360, which can be plasma-enhanced (i.e., PECVD). In another implementation, the second oxide layer deposition 380 includes using a different CVD tool, which can also be plasma-enhanced. The deposition 380 applies a TEOS precursor, such that the second oxide layer 144 may or may not conform to the contour of the magnetic core structure 130. To prepare for further fabrication processes, the second oxide layer 144 is planarized to have a top surface that conforms to the surface of the substrate 107.

Figure 3I:
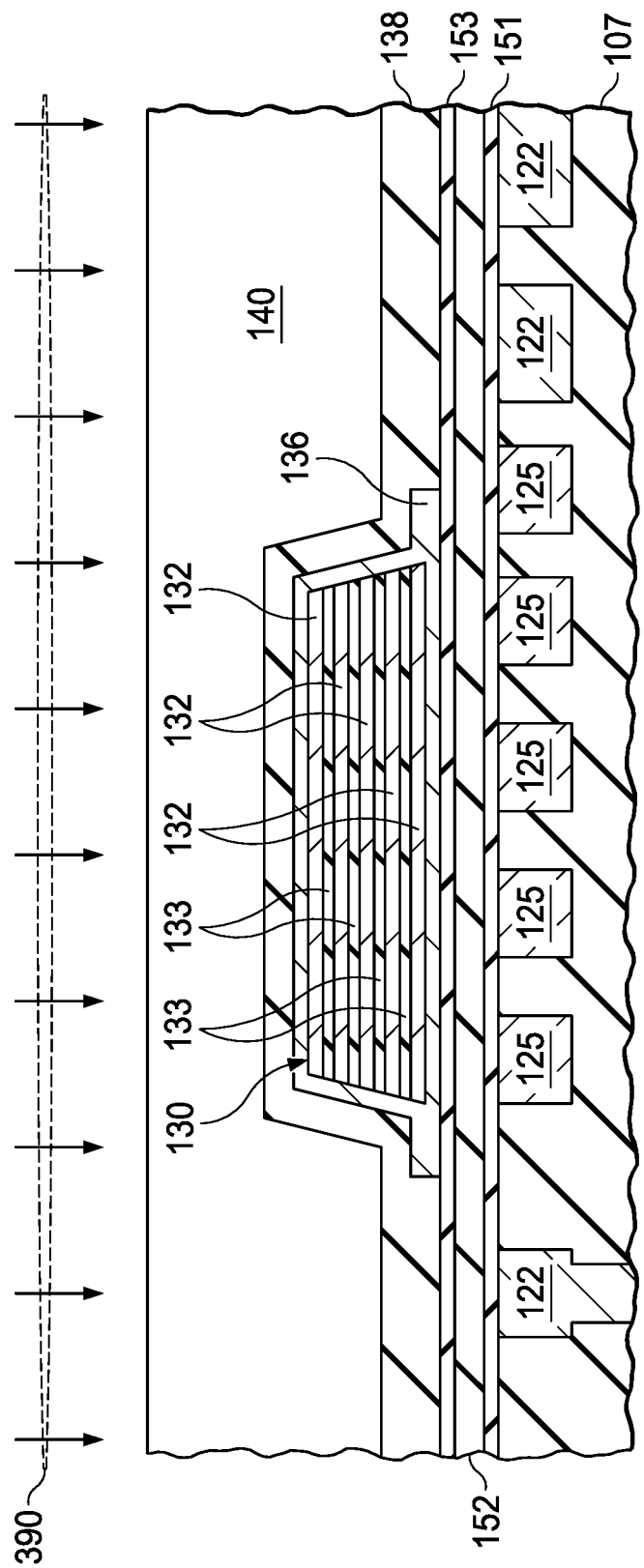

In an alternative process flow where multiple depositional tools are available, the oxide deposition of one wafer can be performed concurrently with the second encapsulation layer deposition 360 of a different wafer. The oxide deposition may take a longer duration than the second encapsulation layer deposition 360. This allows a single oxide layer 140 to be formed above the second encapsulation layer 138. Referring to FIG. 3I, a cross sectional view of an integrated fluxgate device (e.g., 120) is shown according to a process in which step 224 is performed to form a single oxide layer 140. A single oxide layer deposition 390 is performed to deposit a single oxide layer 140. In one implementation, the oxide layer deposition 390 includes using a chemical vapor deposition (CVD) tool, which can be plasma-enhanced (i.e., PECVD). The deposition 390 is performed in a chamber at a second CVD temperature, which can be the same or is near to the first CVD temperature. For example, where the first CVD temperature is around 400° C. (i.e., plus or minus 10° C.), the second CVD temperature can be about 350° C. (i.e., plus or minus 10° C.) or higher.

The deposition 390 applies silane ($SiH_4$) and oxygen (O) as precursors. The oxide layer 140 thus includes a silicon oxide material with a single oxide thickness that is greater than the minimum oxide thickness 143. In one implementation, the single oxide thickness can be the sum of the first oxide thickness 143 and the second oxide thickness 145 as shown in FIG. 1. For instance, the single oxide thickness can be greater than 4,000 Å where the second encapsulation layer 138 has a thickness of about 4,700 Å. Because silicon oxide formed by a silane precursor typically has good uniformity, the single silicon oxide layer 140 conforms to a contour of the magnetic core structure 130 after it is formed. Like the second oxide layer 144 as shown in FIG. 3H however, a planarization process can be performed to planarize the top surface of the single oxide layer 140. As such, the top surface of the planarized single oxide layer 140 conforms to the surface of the substrate 107.

After step 224 is performed, the process 200 proceeds to step 226, which includes forming top coil members (e.g., top coil members 126) above the second encapsulation layer 138 and in the oxide layer 140.

In this description, the term "configured to" describes structural and functional characteristics of one or more tangible non-transitory components. For example, "configured to" can mean a particular configuration that is designed or dedicated to perform a certain function. Within this understanding, a device is "configured to" perform a certain function if such a device includes tangible non-transitory components that can be enabled, activated or powered to perform that certain function. The term "configured to" may encompass being configurable, but is not limited to such a narrow definition. Thus, when used for describing a device, the term "configured to" does not require the described device to be configurable at any given point of time.

Operations are depicted in the drawings in a particular order, but this does not require that such operations be performed in the particular order shown or in sequential order. Also, some illustrated operations are optional to achieve desirable results. In certain circumstances, multitasking and parallel processing may be advantageous. Moreover, the separation of various system components in the embodiments described above does not require such separation in all embodiments.

Modifications are possible in the described embodiments, and other embodiments are possible, within the scope of the claims.

What is claimed is:

1. A method for fabricating an integrated circuit, the method comprising:
    forming a circuit having transistors with active regions developed on a substrate and a metal layer positioned above the active regions for interconnecting the transistors;
    forming a core structure above the metal layer;
    forming a first encapsulation layer covering the core structure and having a first thermal expansion coefficient;
    forming a second encapsulation layer covering the first encapsulation layer over the core structure and having a second thermal expansion coefficient different from the first thermal expansion coefficient; and
    forming an oxide layer above the second encapsulation layer and having an oxide thickness sufficient to mitigate a thermal stress between the first and second encapsulation layers.

2. The method of claim 1, wherein:
    the forming the second encapsulation layer includes depositing a nitride material to form the second encapsulation layer using a chemical vapor deposition (CVD) tool at a first CVD temperature; and
    the forming the oxide layer includes depositing a silane precursor to form the oxide layer using the CVD tool at a second CVD temperature near to the first CVD temperature.

3. The method of claim 2, wherein the first CVD temperature is approximately 400° C., and the second CVD temperature is approximately 350° C.

4. The method of claim 1, wherein:
    the forming the second encapsulation layer includes depositing a nitride material to form the second encapsulation layer using a chemical vapor deposition (CVD) tool for a first duration; and
    the forming the oxide layer includes depositing a silane precursor to form the oxide layer using the CVD tool for a second duration following the first duration and substantially equal to the first duration.

5. The method of claim 1, wherein the forming the oxide layer includes:
    forming a first silicon oxide layer with a silane precursor subsequent to the forming of the second encapsulation layer without substantial cooling, the first silicon oxide layer conforming to a contour of the core structure; and
    forming a second silicon oxide layer with a tetraethyl orthosilicate (TEOS) precursor subsequent to the forming of the first silicon oxide layer and with substantial cooling, the second silicon oxide layer positioned above the first silicon oxide layer and conforming to a surface of the substrate.

* * * * *